United States Patent [19]
Jang et al.

[11] Patent Number: 5,671,176
[45] Date of Patent: Sep. 23, 1997

[54] SEMICONDUCTOR MEMORY DEVICE INCLUDING PROGRAM INHIBITION CAPACITORS AND METHOD FOR CONTROLLING PROGRAM-DISTURB OF NON-SELECTED MEMORY CELLS

[75] Inventors: Dong-soo Jang; Jung-dal Choi, both of Kyungki-do, Rep. of Korea

[73] Assignee: Samsung Electronics Co., Ltd., Suwon, Rep. of Korea

[21] Appl. No.: 715,077

[22] Filed: Sep. 19, 1996

[30] Foreign Application Priority Data

Sep. 19, 1995 [KR] Rep. of Korea ............... 30679/1995

[51] Int. Cl.$^6$ ............................................. G11C 16/06
[52] U.S. Cl. ........................... 365/185.02; 365/185.17; 365/185.18; 365/185.26; 365/185.27; 365/185.28
[58] Field of Search ....................... 365/185.02, 185.17, 365/185.18, 185.26, 185.27, 185.28

[56] References Cited

U.S. PATENT DOCUMENTS

5,581,504  12/1996  Chang ........................... 365/185.17
5,596,523  1/1997  Endoh et al. ..................... 365/182

Primary Examiner—David C. Nelms
Assistant Examiner—Andrew Q. Tran
Attorney, Agent, or Firm—Bell, Seltzer, Park & Gibson

[57] ABSTRACT

An integrated circuit memory device includes a plurality of wordlines, a plurality of program inhibition lines, a plurality of serially connected memory cell transistors, and a plurality of program inhibition capacitors. Each of the memory cell transistors includes a gate connected to a respective one of the wordlines. Each of the program inhibition capacitors has a first terminal connected to a source/drain of a respective one of the memory cell transistors, and a second terminal connected to a respective one of the program inhibition lines. Related methods are also disclosed.

26 Claims, 3 Drawing Sheets

SEMICONDUCTOR MEMORY DEVICE INCLUDING PROGRAM INHIBITION CAPACITORS AND METHOD FOR CONTROLLING PROGRAM-DISTURB OF NON-SELECTED MEMORY CELLS

FIELD OF THE INVENTION

The present invention relates to the field of integrated circuits and more particularly to the field of integrated circuit memory devices.

BACKGROUND OF THE INVENTION

Integrated circuit memory devices are used to store digital data in data processing systems. These memory devices can be classified as volatile and non-volatile memory devices. In a volatile memory device, stored data is lost when the power is cut off. In a non-volatile memory device, stored data is maintained when the power is cut off. There are four types of non-volatile memory devices: read only memory (ROM) devices, programmable read only memory (PROM) devices, erasable programmable read only memory (EPROM) devices, electrically erasable programmable read only memory (EEPROM) devices, and flash memory devices. In a flash memory device, data can be programmed and erased using electrical signals.

Flash memory devices can be classified as NOR type and NAND type flash memory devices. In a NOR type flash memory device, a plurality of cell transistors are coupled in parallel between a bit line and a ground line. In a NAND type flash memory device, a plurality of cell transistors are coupled in series between a bit line and a ground line. The NAND type flash memory device may be preferred because of its relatively low cost and because of its data storage capacity.

A bit of data is stored in a NAND type flash memory device by altering the threshold of a respective memory cell transistor, and the threshold voltage can be changed by performing electrical erase and program operations. The threshold voltage of a memory cell transistor can be varied by changing an electrical charge of a floating gate for that memory cell transistor. In particular, the threshold voltage of a memory cell transistor is lowered after an erase operation, and the threshold voltage is increased after a program operation. In a memory cell transistor with a polysilicon gate NMOS structure, the threshold voltage of a memory cell transistor which has been erased is on the order of −3 V, and the threshold voltage of a memory cell transistor which is then programmed can be on the order of 1 V.

To read the data stored in a particular memory cell transistor, the memory cell transistor is selected using a decoder circuit. As a result of the read operation, the data of a selected memory cell transistor can be provided to a bit line and detected by sensing circuits.

Figure 1:
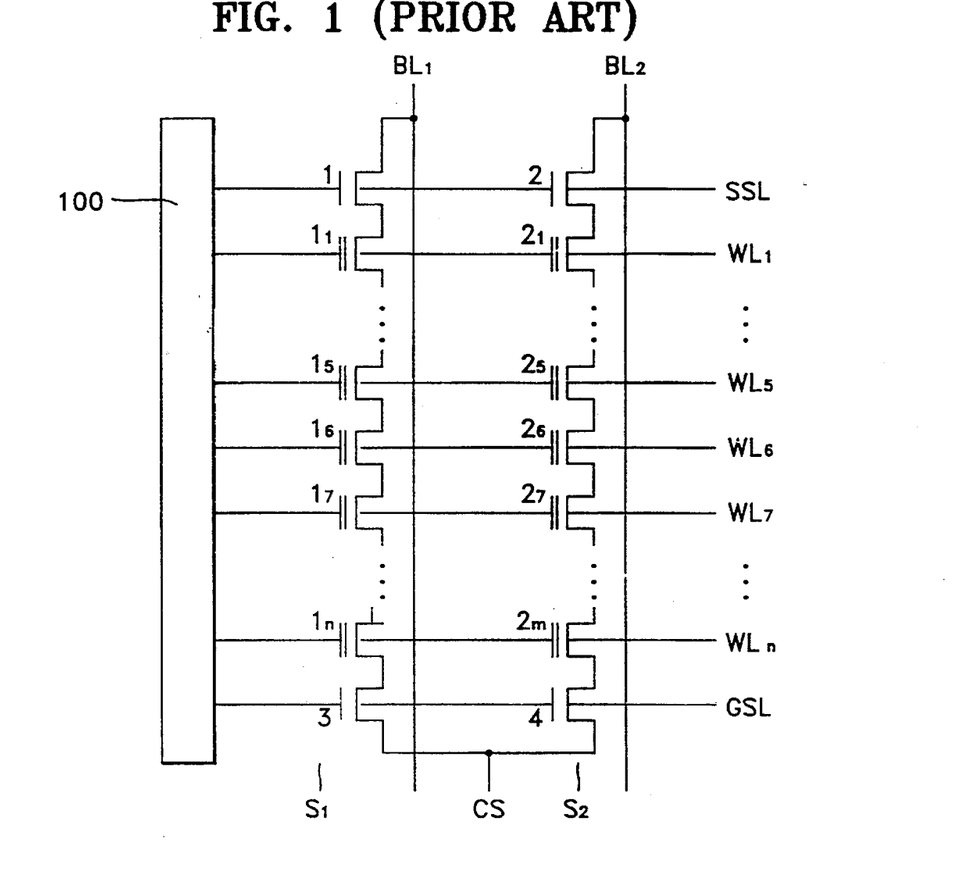
FIG. 1 is a circuit diagram of a NAND type flash memory device according to the prior art.

A circuit diagram of a conventional NAND type flash memory device is illustrated in FIG. 1, and the biased conditions for operating this circuit are provided in Table 1.

TABLE 1

| Bias | Program | Read | Erase | Stand-by |
|---|---|---|---|---|
| BL$_2$ (select) | 0 V | V$_{cc}$ | Floating | Floating |
| BL$_1$ (non-select) | V$_{cc}$ | Floating | Floating | Floating |

TABLE 1-continued

| Bias | Program | Read | Erase | Stand-by |
|---|---|---|---|---|
| SSL | V$_{cc}$ | V$_{cc}$ | Floating | Floating |
| GSL | 0 V | V$_{cc}$ | Floating | Floating |
| CS | V$_{cc}$ | 0 V | Floating | Floating |
| WL$_6$ (select) | V$_{pgm}$ (=18 V) | 0 V | 0 V | Floating |
| WL$_1$–WL$_5$, WL$_7$–WL$_n$ (non-select) | V$_{pass}$ (=10 V) | V$_{read}$ | Floating | Floating |
| Substrate | 0 V | 0 V | V$_{erase}$ | 0 V |

In FIG. 1, the NAND type flash memory device includes a decoder 100, wordlines WL$_{1-n}$, first and second bit lines BL$_{1-2}$, a string select line SSL, a ground select line GSL, and a common source CS. This memory also includes a first string select transistor 1, a second string select transistor 2, a first ground select transistor 3, and a second ground select transistor 4. Furthermore, the memory includes memory cell transistors $1_{1-n}$ of a first string S$_1$, and memory cell transistors $2_{1-m}$ of second string S$_2$. The first string S$_1$ includes m memory cell transistors $1_{1-n}$ connected in series so that the source of each transistor is connected to the drain of an adjacent transistor. As shown, the first string select transistor 1 and the first ground select transistor 3 are also connected in series with the memory cell transistors of the first string. The second string S$_2$ includes m memory cell transistors $2_{1-m}$, the second string select transistor 2, and the second ground select transistor 4.

The first and second strings S$_1$ and S$_2$ of memory cell transistors are arranged in parallel with first and second bit lines BL$_1$ and BL$_2$, respectively. The wordlines WL$_{1-n}$ are connected to the corresponding control gates of the first and second memory cell transistors $1_{1-n}$ and $2_{1-m}$, respectively. Furthermore, the first string select transistor 1 connects the first string of memory cell transistors with the first bit line BL$_1$, and the second string select transistor 2 connects the second string of memory cell transistors with the second bit line BL$_2$. Each of the first and second ground select transistors 3 and 4 connects the respective string of memory cell transistors with the common source CS.

The operation of the flash memory device of FIG. 1 will now be discussed as follows. When reading the data stored in a predetermined memory cell transistor, a 0 volt signal is applied to the respective wordline, and a read voltage signal V$_{read}$ is applied to each of the non-selected wordlines wherein the read voltage signal is higher than the power supply voltage V$_{cc}$. The power supply voltage V$_{cc}$ is applied to the string select transistors 1 and 2 and the ground select transistors 3 and 4, as well as the selected bit line. The common source CS is grounded. In this condition, each of the memory cell transistors connected to the non-selected wordlines and the selected bit line turn "ON" regardless of the state of the data stored therein. The memory cell transistor connected to the selected wordline and the selected bit line, however, turns "ON" or "OFF" according to the threshold voltage thereof. If the selected memory cell transistor turns "ON", a current path is thus formed from the bit line to the common source. If the selected memory cell transistor remains "OFF", no current path is formed from the bit line to the common source.

Data can be recorded in a memory cell transistor by performing a program operation wherein the threshold voltage of the memory cell transistor is increased by charging the floating gate of that transistor with electrons. During the program operation, a relatively high electric potential with respect to the substrate is applied to the control gate of the selected memory cell transistor. Electrons from the substrate are thus driven to the floating gate thereby charging the floating gate according to the Fowler-Nordheim tunneling effect (F-N tunneling). The accumulation of electrons at the floating gate increases the threshold voltage of the memory cell transistor.

The threshold voltage of the memory cell transistor can be reduced by an erasing operation wherein electrons from the floating gate are discharged to the substrate. In the erasing operation, a relatively high electrical potential with respect to the control gate is applied to the substrate so that the floating gate is charged with holes. Stated in other words, data can be stored in a memory cell transistor of a flash memory device by charging electrons to or discharging electrons from a floating gate of the transistor. More particularly, the floating gate is charged or discharged by applying appropriate voltages to the control gates and the substrate.

Data can thus be written into a selected memory cell transistor by performing either a program operation or an erase operation. When the data to be written to a selected memory cell transistor will not change the state of the erased transistor, there is no need to program the selected transistor. Accordingly, a corresponding bit line is not selected. When the data to be written to the selected memory cell transistor requires that the state of the erased transistor be changed, the floating gate of the selected transistor is charged with electrons by the F-N tunneling effect as discussed above. Accordingly, the corresponding bit line is selected.

When programming a memory cell transistor of the second string, the first bit line $BL_1$ is not selected, and the second bit line $BL_2$ is selected. Accordingly, data corresponding to the erased state can be written in memory cell transistor $1_6$ connected to the first bit line $BL_1$, and data corresponding to the programmed state can be written into memory cell transistor $2_6$ connected to the second bit line $BL_2$. The power supply voltage $V_{cc}$ is applied to the string select line SSL, a 0 volt signal is applied to the select bit line $BL_2$, the power supply voltage $V_{cc}$ is applied to the non-selected bit line $BL_1$, and a 0 volt signal is applied to the ground select line GSL. While in this condition, a program voltage $V_{pgm}$ on the order of about 18 volts is applied to the selected wordline $WL_6$, and a pass voltage $V_{pass}$ on the order of about 10 volts is applied to the non-selected wordlines $WL_{1-5}$ and $WL_{7-n}$. In addition, the power supply voltage $V_{cc}$ is applied to the common source CS.

While in this bias voltage condition, the source, drain, and channel voltages of the memory cell transistors $2_{1-m}$ of the second string all become 0 volts regardless of the pass voltage $V_{pass}$ or the program voltage $V_{pgm}$. The program voltage $V_{pgm}$ is thus applied between the control gate and the channel of the selected memory cell transistor $2_6$. Accordingly, F-N tunneling occurs in the selected memory cell transistor $2_6$ so that electrons move from the channel region of the substrate to the floating gate thereby increasing the threshold voltage of the memory cell transistor $2_6$ thus programming the cell.

The source and gate of the string select transistor 1 are respectively connected to the nonselected first bit line $BL_1$ and the string select line SSL. Accordingly, the voltages of the source and gate of the string select transistor 1 are equal to the power supply voltage $V_{cc}$. The voltages of the control gate of the memory cell transistors $1_{1-n}$ of the non-selected first string thus increase from 0 volts to the pass voltage $V_{pass}$ or to the program voltage $V_{pgm}$, and the cell transistors $1_{1-n}$ are "ON" during the voltage increase. A current is thus supplied from the non-selected bit line $BL_1$ so that the voltage of the channel region is the difference between the power supply voltage $V_{cc}$ and the threshold voltage $V_{th}$ of the string select transistor 1.

The string select transistor 1 thus turns off. Furthermore, when the pass voltage $V_{pass}$ and the program voltage $V_{pgm}$ continue to increase, the potential of the source, drain, and channel of each memory cell transistor $1_{1-n}$ in the string is boosted to a potential higher than the voltage difference of the power supply voltage $V_{cc}$ and the threshold voltage $V_{th}$ of the string select transistor 1. This boost is due to capacitor coupling. Accordingly, the voltages of the source, drain, and channel of each memory cell transistor $1_{1-n}$ in the string connected to the non-selected first bit line $BL_1$ all increase to the boosted voltage $V_{boost}$ which is on the order of 7 to 8 volts.

As described above, a program voltage $V_{pgm}$ on the order of 18 volts is applied to the control gate of the memory cell transistor $1_6$ connected to the selected wordline $WL_6$. In addition, the boosting voltage $V_{boost}$ on the order of 7 to 8 volts is applied to the channel of the memory cell transistor $1_b$. This voltage difference between the control gate and the channel is generally assumed to be insufficient to generate significant F-N tunneling, and programming is assumed not to occur.

According to conventional flash memory designs, it is assumed that F-N tunneling does not occur in a memory cell transistor below a predetermined voltage such as the pass voltage $V_{pass}$ or the difference between the program voltage $V_{pgm}$ and the boost voltage $V_{boost}$. In reality, however, F-N tunneling does occur to a small degree when the voltage between the control gate and the channel is equal to the pass voltage or the difference between the program voltage $V_{pass}$ and the boost voltage $V_{boost}$, thus undesirably changing the threshold voltage of the non-selected memory cell transistors.

Figure 2:
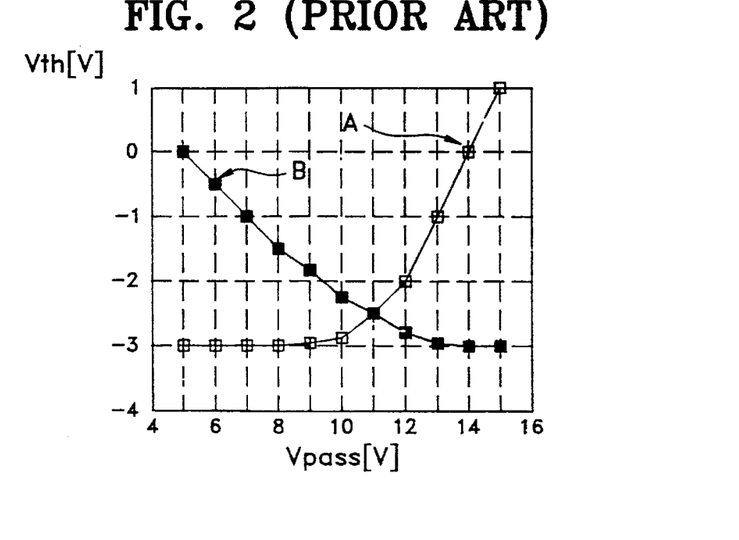
FIG. 2 is a graph illustrating variations in the threshold voltage of a non-selected memory cell transistor with respect to the pass voltage during programming operations for the NAND type flash memory device of FIG. 1.

As shown in FIG. 1, the memory cell transistors $2_{2-5}$ and $2_{7-m}$ are connected to the non-selected wordlines $WL_{1-5}$ and $WL_{7-n}$ of the selected second bit line $BL_2$. The voltage of each of the control gates is the pass voltage $V_{pass}$, and the voltage of each of the channels is 0 volts, so that a relatively small number of electrons tunnel from each channel to the respective floating gate thus causing a threshold voltage shift. The line A of FIG. 2 illustrates the variation of the threshold voltage shift of a memory cell transistor connected to a selected bit line and connected to a non-selected wordline. As shown, the threshold voltage shift $\Delta V_{th}$ increases as the pass voltage $V_{pass}$ increases.

Referring again to FIG. 1, the memory cell transistor $1_6$ is included in the first string $S_1$ connected to the non-selected first bit line $BL_1$ and this memory cell transistor $1_6$ is also connected to the selected wordline $WL_6$. The program voltage $V_{pgm}$ on the order of 18 volts is applied to the gate of this transistor, and the boosted voltage $V_{boost}$ on the order of 7 to 8 volts is applied to the channel of the transistor. A relatively small amount of F-N tunneling current thus flows from the channel to the floating gate thereby increasing the threshold voltage of this transistor. In this case, the threshold voltage shift decreases as the boosted voltage increases. The boosted voltage $V_{boost}$, however, is proportional to the pass voltage $V_{pass}$, because the boost voltage $V_{boost}$ has been boosted as a result of the capacitor coupling of the pass voltage $V_{pass}$. Accordingly, the threshold voltage shift of the memory cell transistor $1_6$ corresponding to the non-selected bit line $BL_1$ and connected to the selected wordline $WL_6$ is inversely proportional to the pass voltage $V_{pass}$. This threshold shift is illustrated in curve B of FIG. 2.

Accordingly, increases in the program voltage $V_{pgm}$ and increases the pass voltage $V_{pass}$ both result in undesired shifts of threshold voltages of non-selected memory cell transistors. Increases in the program voltage $V_{pgm}$ cause shifting of the threshold voltage of the memory cell transistor $1_6$ corresponding to the non-selected first bit line $BL_1$ and connected to the selected wordline $WL_6$. Increases in the pass voltage $V_{pass}$ cause voltage shifts in the memory cell transistors $2_{1-5}$ and $2_{7-n}$ corresponding to the selected second bit line $BL_2$ and connected to the non-selected wordlines $WL_{1-5}$ and $WL_{7-n}$.

As shown in FIG. 2, the variations of the threshold voltages with respect to the pass voltage $V_{pass}$ are complementary. In order to reduce undesired shifts in the threshold voltages of unselected memory cell transistors due to the program voltage $V_{pgm}$ and the pass voltage $V_{pass}$, the pass voltage $V_{pass}$ should be on the order of about 10 volts.

In order to program desired data in a flash memory device, data previously stored in a selected memory cell must first be erased. This operation is thus called an erasing operation. When an erasing operation is performed in a NAND type flash memory device, the biased condition to be applied to the selected memory cell transistor is shown in Table 1.

The erasing operation in a NAND type flash memory device is generally performed on all memory cell transistors of a string. When erasing the memory cell transistors of the selected string, a 0 volt signal is applied to each of the wordlines, and an erase voltage $V_{erase}$ on the order of 20 volts is applied to the substrate. Accordingly, electrons tunnel from the floating gate to the channel as a result of the F-N tunneling effect. The threshold voltage of each of the memory cell transistors is thus reduced so as to complete the erasing operation.

In the event that the erasing operation is intended for memory cell transistors corresponding to a selected wordline, a 0 volt signal is applied to the selected wordline $WL_6$ to be erased. The non-selected wordlines $WL_{1-5}$ and $WL_{7-n}$ are allowed to float and an erase voltage on the order of 20 volts is applied to the substrate. The voltage of the control gates connected to the floated wordlines $WL_{1-5}$ and $WL_{7-n}$ are approximately equal to the erase voltage $V_{erase}$ as a result of capacitor coupling. Accordingly, significant discharge of electrons from the floating gate to the substrate by the F-N tunneling effect does not occur.

When a string of memory cell transistors is erased and then individual memory cell transistors within the string are programmed, unprogrammed memory cell transistors in the string may experience threshold voltage shifts as a result of the pass voltage $V_{pass}$ on the non-selected wordlines. In the case that erasing and programming operations are repeatedly performed by wordlines, the pass voltage $V_{pass}$ is applied to the non-selected wordlines $WL_{1-5}$ and $WL_{7-n}$, and the program voltage $V_{pgm}$ is applied to the selected wordline $WL_6$. Accordingly, the pass voltage $V_{pass}$ is repeatedly applied to the control gate of the memory cell transistors which are not programmed so that the threshold voltage of a non-selected memory cell transistor is changed thereby increasing the possibility of a memory failure.

SUMMARY OF THE INVENTION

It is therefore an object of the present invention to provide improved integrated circuit memory devices and methods.

It is another object of the present invention to provide integrated circuit memory devices and methods wherein a selected memory cell can be programmed without significantly effecting the threshold voltages of unprogrammed memory cell transistors.

These and other objects are provided according to the present invention by an integrated circuit memory device including a plurality of programmable memory cell transistors wherein the voltage of a channel region of a non-selected memory cell transistor is boosted when programming the selected memory cell transistor. Accordingly, the threshold voltage of the non-selected memory cell transistor is not significantly changed when programming the selected memory cell transistor. More particularly, a program inhibition capacitor can be connected to the non-selected transistor and driven with a program inhibition voltage to boost the voltage of the channel region of the non-selected memory cell transistor.

In particular, an integrated circuit memory device according to the present invention can include a plurality of wordlines, a plurality of program inhibition lines, a plurality of serially connected memory cell transistors, and a plurality of program inhibition capacitors. Each of the memory cell transistors includes a gate connected to a respective one of the wordlines. Each of the program inhibition capacitors has a first terminal connected to a respective one of the memory cell transistors and a second terminal connected to a respective one of the program inhibition lines. Each of the program inhibition lines may correspond to a respective one of the wordlines, or the program inhibition lines can be connected to a common program inhibition line.

The integrated circuit memory device may also include a bit line, a common source line, a string select transistor, and a ground select transistor. The string select transistor is connected between the bit line and a first one of the serially connected memory cell transistors, and the ground select transistor is connected between a last one of the serially connected memory cell transistors and the common source line.

The integrated circuit memory device may also include a second bit line, a second plurality of serially connected memory cell transistors, a second plurality of program inhibition capacitors, a second string select transistor, and a second ground select transistor. Each of the second plurality of memory cell transistors includes a gate connected to a respective one of the wordlines, and each of the second plurality of program inhibition capacitors has a first terminal connected to a respective one of the memory cell transistors of the second plurality and a second terminal connected to a respective one of the program inhibition lines. The second string select transistor is connected between the second bit line and a first one of the serially connected memory cell transistors of the second plurality, and the second ground select transistor is connected between a last one of the serially connected memory cell transistors of the second plurality and the common source line.

Each of the memory cell transistors may include a floating gate which can be charged to control a threshold voltage of the memory cell transistor. Data programming means can be used to program a selected one of the memory cell transistors. In particular, the data programming means provides a program inhibition voltage to the plurality of program inhibition lines, provides a program voltage to a selective one of the wordlines connected to the selected memory cell transistor, and provides a pass voltage to all of the wordlines other than the selected wordline. The pass voltage is higher than a threshold voltage of one of the memory cell transistors and lower than the program inhibition voltage. In particular, the program inhibition voltage can be on the order of 10 V, the program voltage can be on the order of 18 V, and the pass voltage can be on the order of 2 V.

The memory device can also include erasing means for erasing data from a selected one of the memory cell transistors by providing an erase voltage to a substrate of memory device. The erasing means can alternately provide either a power supply voltage to the program inhibition lines or allow the program inhibition lines to float when erasing data from a memory cell transistor.

According to another aspect of the present invention, a method is provided for programming a selected memory cell transistor of an integrated circuit memory device including a plurality of wordlines, and first and second pluralities of serially connected memory cell transistors. In addition, each of the memory cell transistors of the first and second pluralities include a gate connected to a respective one of the wordlines. According to this method, a program voltage is provided to a selected one of the wordlines connected to the selected memory cell transistor of the first plurality of memory cell transistors. A pass voltage is provided to all of the wordlines other than the selected wordline wherein the pass voltage is higher than a threshold voltage of one of the memory cell transistors. A potential of a channel region of a memory cell transistor of the second plurality connected to the selected wordline is boosted to a boost voltage on the order of at least about 70% that of the program voltage. The program voltage can be on the order of 18 V, the pass voltage can be on the order of 2 V, and the boost voltage can be on the order of at least about 13 V.

According to the present invention, a pass voltage $V_{pass}$ can be reduced during program operations so that the threshold voltage of non-selected memory cell transistors is not significantly changed during programming operations. In particular, by boosting the voltage of channel regions of non-selected memory cell transistors during programming operations, a voltage difference between the channel and the gate of non-selected memory cell transistors can be reduced thereby reducing shifts in the threshold voltages of non-selected selected memory cell transistors.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3:
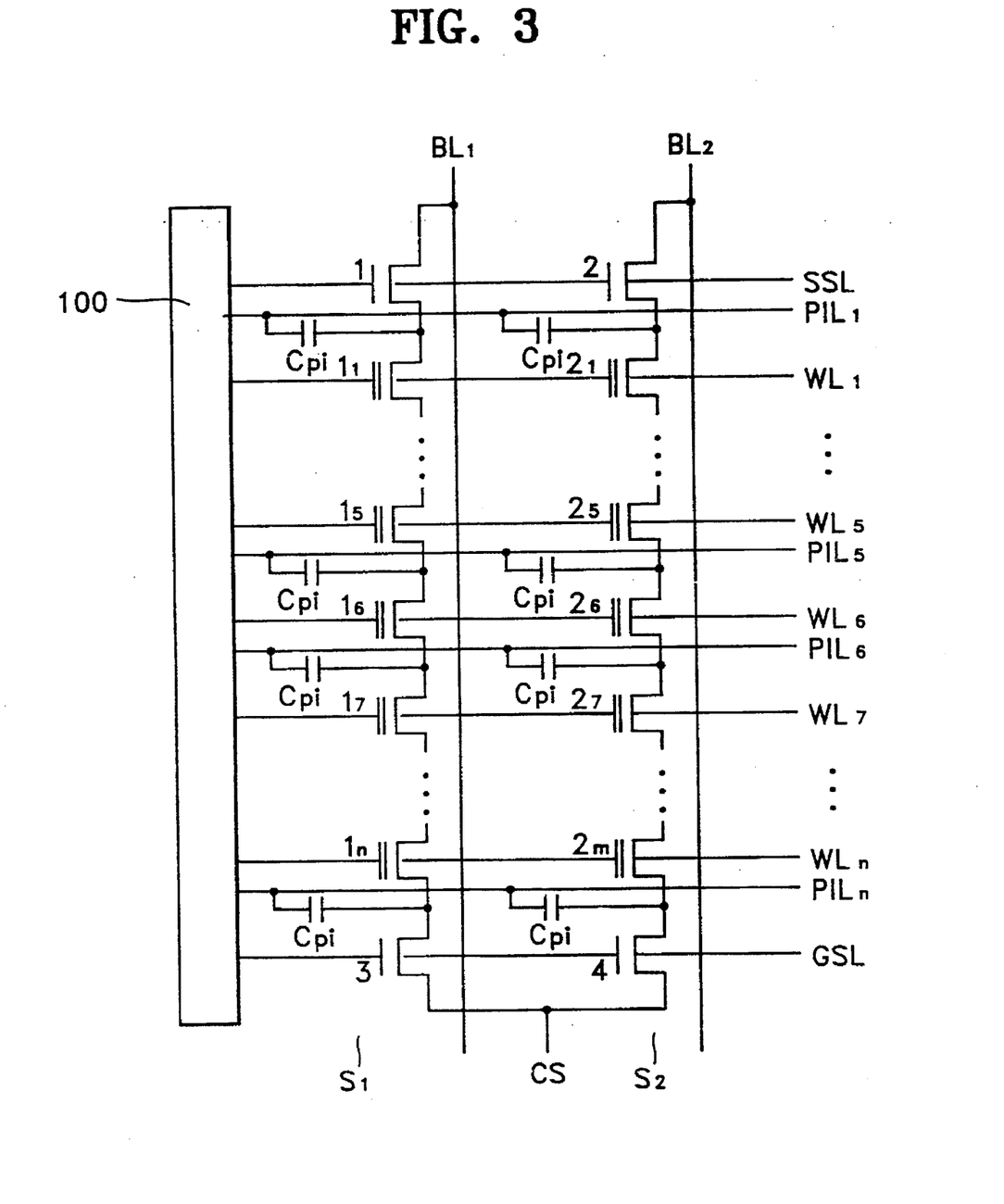
FIG. 3 is a circuit diagram of a NAND type flash memory device according to the present invention.

A circuit diagram of a NAND type flash memory device according to the present invention is illustrated in FIG. 3. A first string $S_1$ includes n memory cell transistors $1_{1-n}$ connected in series so that a source of each transistor is connected to a drain of an adjacent transistor. The first string select transistor 1 and a first ground select transistor 3 are connected to opposite ends of this first string of memory cell transistors. A second string $S_2$ includes m memory cell transistors $2_{1-m}$ connected in series with a second string select transistor 2 and a second ground select transistor 4 connected to opposite ends of the second string of memory cell transistors.

The first and second string select transistors 1 and 2 are respectively connected to the first and second bit lines $BL_1$ and $BL_2$. The first and second ground select transistors 3 and 4 are each connected to the common source CS. Furthermore, two or more string select transistors can be included with a string of memory cell transistors. Similarly, two or more ground select transistors can be included with a string of memory cell transistors.

As shown, each string includes a plurality of memory cell transistors connected in series between the respective string select and ground select transistors. A plurality of wordlines $WL_{1-n}$ are connected to the respective control gates of the memory cell transistors. The program inhibition lines $PIL_{1-n}$ correspond to respective wordlines $WL_{1-n}$, and program inhibition capacitors $C_{1-n}$ are connected between respective program inhibition lines and source/drains of memory cell transistors.

Program, read, erase, and stand-by operating voltages for the flash memory device of the present invention are shown in Table 2.

TABLE 2

| Bias | Item | | | |
|---|---|---|---|---|
| | Program | Read | Erase | Stand-by |
| $BL_2$ (select) | 0 V | $V_{cc}$ | Floating | Floating |
| $BL_1$ (non-select) | $V_{cc}$ | Floating | Floating | Floating |
| SSL | $V_{cc}$ | $V_{cc}$ | Floating | Floating |
| GSL | 0 V | $V_{cc}$ | Floating | Floating |
| CS | $V_{cc}$ | 0 V | Floating | Floating |
| $WL_6$ (select) | $V_{pgm}$ (=18 V) | 0 V | 0 V | Floating |
| $WL_1$-$WL_5$, $WL_7$-$WL_n$ (non-select) | $V_{pass}$ (=2 V) | $V_{read}$ | Floating | Floating |
| $PIL_1$-$PIL_n$ | 10 V | $V_{cc}$ | Floating | Floating |
| Substrate | 0 V | 0 V | $V_{erase}$ | 0 V |

During the programming operations, a 0 V signal is applied to the selected second bit line $BL_2$, and the power supply voltage $V_{cc}$ is applied to the non-selected first bit line $BL_1$ and the string select line SSL. A program voltage $V_{pgm}$ on the order of about 18 V is applied to the selected wordline $WL_6$, and the pass voltage $V_{pass}$ is applied to the non-selected wordlines $WL_{1-5}$ and $WL_{7-n}$. The pass voltage $V_{pass}$ is the minimum voltage required to turn on a memory cell transistor and is higher than the threshold voltage of the program cell and lower than the program inhibition voltage. A 0 V signal is applied to the ground select line GSL, and the power supply voltage is applied to the common source CS. A program inhibition voltage $V_{pi}$ on the order of about 10 V boosts the source of a memory cell transistor to prevent that memory cell transistor from turning on, and this program inhibition voltage is applied to each of the program inhibition lines $PIL_{1-n}$.

When the program voltages discussed above are applied to the flash memory device of the present invention, the voltages of the source, drain, and channel of each of the transistors 2, $2_{1-m}$ and 4 within the second string $S_2$ connected to the second bit line $BL_2$ are driven to 0 V regardless of the pass voltage $V_{pass}$, the program voltage $V_{pgm}$, or the program inhibition voltage $V_{pi}$. Accordingly, the program voltage $V_{pgm}$ is applied to the control gate of the selected memory cell transistor $2_6$, and the channel of the selected memory cell transistor is maintained at 0 V. Fowler-Nordheim tunneling thus occurs in the selected memory cell transistor $2_6$ so that electrons tunnel from the channel region to the floating gate thus changing the threshold voltage of the memory cell transistor.

In the case of the first string select transistor 1, the source is connected to the non-selected first bit line $BL_1$ and the gate is connected to the string select line SSL. The power supply voltage $V_{cc}$ is applied to the source and the gate of the first string select transistor 1. The ground select transistor 3 has a source connected to the common source CS and a gate connected to the ground select line GSL. Accordingly, the power supply voltage $V_{cc}$ from the common source CS is applied to the source of the ground select transistor 3, and a 0 V signal from the ground select line GSL is applied to the gate of the ground select transistor 3.

When the voltages of the gates of the memory cell transistors $1_{1-n}$ of the first string $S_1$ are increased to the pass voltage $V_{pass}$ which is applied to the respective wordlines $WL_{1-n}$ or the program voltage $V_{pgm}$ from 0 V, the memory cell transistors $1_{1-n}$ turn on so that current is supplied from the first bit line $BL_1$. The voltage of the channel can thus be determined by subtracting the threshold voltage of the memory cell transistor from the pass voltage $V_{pass}$.

In this state, the program inhibition voltage $V_{pi}$ is applied to the program inhibition lines $PIL_{1-n}$, and the source/drains of the memory cell transistors connected to the non-selected wordlines and the non-selected bit line are boosted by the program inhibition voltage $V_{pi}$ as a result of capacitor coupling. In particular, the boosted voltage of the source/drains of the memory cell transistors will be approximately equal to $(V_{pi} \times C_{jn})/(C_{jn}+C_{pi})$, and the memory cell transistors will be turned off. In the previously listed formula, the variable $C_{jn}$ represents the junction capacitance of the source/drain of a memory cell transistor.

Accordingly, the source, drain, and channel of the memory cell transistor $1_6$ connected to the selected wordline $WL_6$ and the non-selected bit line $BL_1$ can have a voltage on the order of 13–14 V, which is relatively close to the program voltage $V_{pgm}$. The voltage difference between the control gate and the channel is thus not enough to generate significant F-N tunneling and programming therefore does not occur. Furthermore, the structure of the flash memory device discussed above with regard to FIG. 3 and Table 2 has improved performance and reliability during programming and erasing operations in a page unit.

The input voltages required to perform an erase operation for the flash memory device of FIG. 3 are shown in Table 2. When erasing all memory cell transistors of a selected string, a 0 V signal is applied to all of the wordlines $WL_{1-n}$ and an erase voltage $V_{erase}$ on the order of about 20 V is applied to the substrate of the flash memory device. Accordingly, electrons stored in the floating gates are discharged to the substrate by F-N tunneling so that the threshold voltage of the erased memory cell transistors are lowered. During the erase operation, the program inhibition lines $PIL_{1-n}$ are allowed to float.

To read data from a memory cell transistor of the flash memory device of FIG. 3, the power supply voltage $V_{cc}$ is applied to the gates of the string select transistors 1 and 2 and the ground select transistors 3 and 4. A 0 V signal is applied to the selected wordline $WL_6$, and the read voltage $V_{read}$ is applied to the non-selected wordlines $WL_{1-5}$ and $WL_{7-n}$ corresponding to the non-selected memory cell transistors. The non-selected memory cell transistors thus turn on in response to the read voltage $V_{read}$. In addition, the power supply voltage $V_{cc}$ is applied to the selected bit line, a 0 V signal is applied to the common source CS, and the non-selected bit line is allowed to float. The program inhibition lines $PIL_{1-n}$ can alternately be allowed to float or be driven with the power supply voltage $V_{cc}$. To maintain the flash memory device in a stand-by state, the bit lines $BL_{1-2}$, the wordlines $WL_{1-n}$, the select lines SSL and GSL, the common source CS, and the program inhibition lines $PIL_{1-n}$ are allowed to float.

Figure 4:
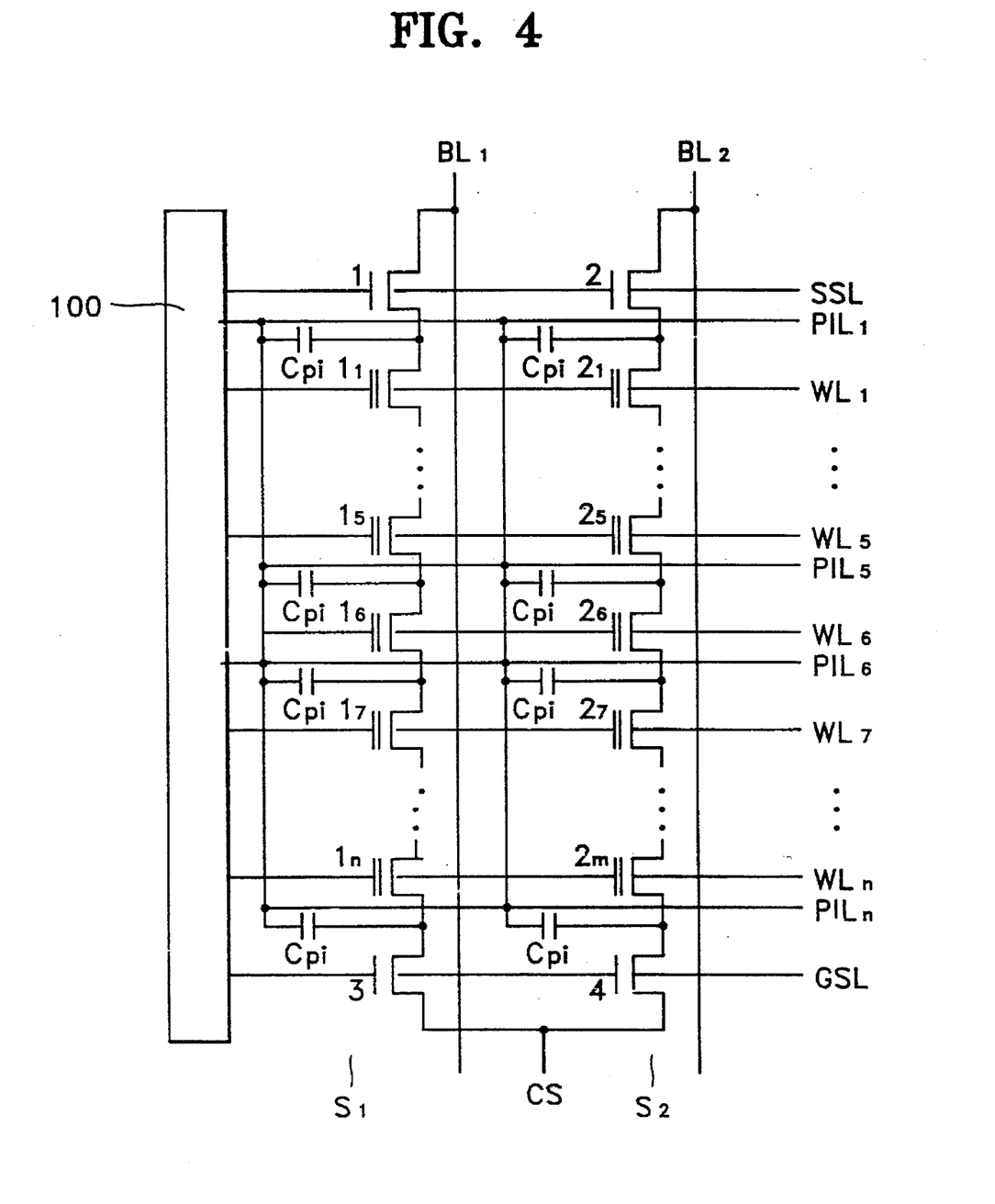
FIG. 4 is a circuit diagram of a second NAND type flash memory device according to the present invention.

A circuit diagram for a second NAND type flash memory device according to the present invention is illustrated in FIG. 4. In particular, the plurality of program inhibition capacitors are connected in parallel to a single program inhibition line. The operating voltages for the memory device of FIG. 4 are the same as those discussed above with regard to FIG. 3.

According to flash memory devices of the prior art, a pass voltage $V_{pass}$ on the order of 10 V is applied to non-selected wordlines during a program operation to reduce undesired electron tunneling in memory cell transistors not being programmed. The threshold voltage of the non-selected memory cell transistors may, however, be subjected to enough electron tunneling to cause a memory fault as a result of the program voltage and pass voltage. According to the flash memory device of the present invention, program inhibition capacitors are coupled between program inhibition lines and the source/drains of the memory cell transistors. Accordingly, a program inhibition voltage $V_{pi}$ applied to the program inhibition lines can be used to boost the voltage of the source/drains of the non-selected memory cell transistors while allowing the pass voltage $V_{pass}$ which is applied to the gates of the non-selected memory cell transistors to be reduced. The threshold shift of non-selected memory cell transistors during a programming operation can thus be reduced thereby improving the reliability of the memory device. The memory device of the present invention is also useful for programming and erasing by page.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device comprising:
   a plurality of wordlines;
   a plurality of program inhibition lines;
   a plurality of serially connected memory cell transistors wherein each of said memory cell transistors includes a control gate connected to a respective one of said wordlines; and
   a plurality of program inhibition capacitors wherein each of said program inhibition capacitors has a first terminal connected to a respective one of said memory cell transistors and a second terminal connected to a respective one of said program inhibition lines.

2. An integrated circuit memory device according to claim 1 wherein said plurality of program inhibition lines are connected to a common program inhibition line.

3. An integrated circuit memory device according to claim 1 wherein each of said program inhibition lines corresponds to a respective one of said wordlines.

4. An integrated circuit memory device according to claim 1 further comprising:
- a bit line;
- a common source line;
- at least one string select transistor connected between said bit line and a first one of said serially connected memory cell transistors; and
- at least one ground select transistor connected between a last one of said serially connected memory cell transistors and said common source line.

5. An integrated circuit memory device according to claim 4 further comprising:
- a second bit line;
- a second plurality of serially connected memory cell transistors wherein each of said second plurality of memory cell transistors includes a control gate connected to a respective one of said wordlines;
- a second plurality of program inhibition capacitors wherein each of said second plurality of program inhibition capacitors has a first terminal connected to a respective one of said memory cell transistors of said second plurality and a second terminal connected to a respective one of said program inhibition lines;
- at least one second string select transistor connected between said second bit line and a first one of said serially connected memory cell transistors of said second plurality; and
- at least one second ground select transistor connected between a last one of said serially connected memory cell transistors of said second plurality and said common source line.

6. An integrated circuit memory device according to claim 1 wherein each of said memory cell transistors includes a floating gate which can be charged to control a threshold voltage of said memory cell transistor.

7. An integrated circuit memory device according to claim 1 further comprising:
- data programming means for programming a selected one of said memory cell transistors by providing a program inhibition voltage to said plurality of program inhibition lines, by providing a program voltage to a selected one of said wordlines connected to said selected memory cell transistor, and by providing a pass voltage to all of said wordlines other than said selected wordline wherein said pass voltage is higher than a threshold voltage of one of said memory cell transistors and lower than said program inhibition voltage.

8. An integrated circuit memory device according to claim 7 wherein said program inhibition voltage is on the order of 10 volts, said program voltage is on the order of 18 volts, and said pass voltage is on the order of 2 volts.

9. An integrated circuit memory device according to claim 1 further comprising:
- erasing means for erasing data from a selected one of said memory cell transistors by providing an erase voltage to a substrate of said memory device.

10. An integrated circuit memory device according to claim 1 further comprising:
- erasing means for erasing data from a selected one of said memory cell transistors by providing an erase voltage to a substrate of said memory device and by providing a power supply voltage to said program inhibition lines.

11. An integrated circuit memory device according to claim 1 further comprising:
- erasing means for erasing data from a selected one of said memory cell transistors by providing an erase voltage to a substrate of said memory device and by allowing said program inhibition lines to float electrically.

12. An integrated circuit memory device according to claim 1 further comprising:
- data read means for reading data from a selected one of said memory cell transistors by providing a power supply voltage to said program inhibition lines and by providing a signal on the order of 0 volts to a wordline connected to said selected memory cell transistor.

13. An integrated circuit memory device according to claim 1 further comprising:
- data read means for reading data from a selected one of said memory cell transistors by providing a signal on the order of 0 volts to a wordline connected to said selected memory cell transistor and by allowing said program inhibition lines to float.

14. An integrated circuit memory device according to claim 1 further comprising:
- stand-by means for allowing said wordlines and said program inhibition lines to float electrically thus putting said integrated circuit memory device in a stand-by state.

15. An integrated circuit memory device according to claim 1 further comprising:
- stand-by means for allowing said wordlines to float electrically and for providing a power supply voltage to said program inhibition lines thus putting said integrated circuit memory device in a stand-by state.

16. A method for operating an integrated circuit memory device including a plurality of wordlines, a plurality of program inhibition lines, a plurality of serially connected memory cell transistors wherein each of said memory cell transistors includes a control gate connected to a respective one of said wordlines, a plurality of program inhibition capacitors wherein each of said capacitors has a first terminal connected to a respective one of said memory cell transistors and a second terminal connected to a respective one of said program inhibition lines, said method comprising the steps of:
- programming a selected one of said memory cell transistors by providing a program inhibition voltage to said plurality of program inhibition lines, by providing a program voltage to a selected one of said wordlines connected to said selected memory cell transistor, and by providing a pass voltage to all of said wordlines other than said selected wordline wherein said pass voltage is higher than a threshold voltage of one of said memory cell transistors and lower than said program inhibition voltage.

17. A method according to claim 16 wherein said program inhibition voltage is on the order of 10 volts, said program voltage is on the order of 18 volts, and said pass voltage is on the order of 2 volts.

18. A method according to claim 16 further comprising the step of:
- erasing data from a selected one of said memory cell transistors by providing an erase voltage to a substrate of said memory device.

19. A method according to claim 16 further comprising the step of:
- erasing data from a selected one of said memory cell transistors by providing an erase voltage to a substrate of said memory device and by providing a power supply voltage to said program inhibition lines.

20. A method according to claim 16 further comprising the step of:

erasing data from a selected one of said memory cell transistors by providing an erase voltage to a substrate of said memory device and by allowing said program inhibition lines to float electrically.

21. A method according to claim 16 further comprising the step of:

reading data from a selected one of said memory cell transistors by providing a power supply voltage to said program inhibition lines and by providing a signal on the order of 0 volts to a wordline connected to said selected memory cell transistor.

22. A method according to claim 16 further comprising the step of:

reading data from a selected one of said memory cell transistors by providing a signal on the order of 0 volts to a wordline connected to said selected memory cell transistor and by allowing said program inhibition lines to float.

23. A method according to claim 16 further comprising the step of:

allowing said wordlines and said program inhibition lines to float electrically thus putting said integrated circuit memory device in a stand-by state.

24. A method according to claim 16 further comprising the step of:

allowing said wordlines to float electrically; and providing a power supply voltage to said program inhibition lines thus putting said integrated circuit memory device in a stand-by state.

25. A method for programming a selected memory cell transistor of an integrated circuit memory device including a plurality of wordlines, a first plurality of serially connected memory cell transistors wherein each of said memory cell transistors of said first plurality includes a control gate connected to a respective one of said wordlines, and a second plurality of serially connected memory cell transistors wherein each of said memory cell transistors of said second plurality includes a control gate connected to a respective one of said wordlines, said method comprising the steps of:

providing a program voltage to a selected one of said wordlines connected to said selected memory cell transistor of said first plurality of memory cell transistors;

providing a pass voltage to all of said wordlines other than said selected wordline wherein said pass voltage is higher than a threshold voltage of one of said memory cell transistors; and boosting a potential of a channel region of a memory cell transistor of said second plurality of memory cell transistors connected to said selected wordline to a boost voltage on the order of at least about 70% that of the program voltage.

26. A method according to claim 25 wherein said program voltage is on the order of 18 V, wherein said pass voltage is on the order of 2 V, and wherein said boost voltage is on the order of at least about 13 V.

* * * * *